United States Patent
Tan

(10) Patent No.: US 8,432,172 B2
(45) Date of Patent: Apr. 30, 2013

(54) MEASURING APPARATUS AND METHOD FOR CAPACITOR

(75) Inventor: Po-Chao Tan, Zhonghe (TW)

(73) Assignee: Brymen Technology Corporation, New Taipei (TW)

( * ) Notice: Subject to any disclaimer, the term of this patent is extended or adjusted under 35 U.S.C. 154(b) by 371 days.

(21) Appl. No.: 12/902,195

(22) Filed: Oct. 12, 2010

(65) Prior Publication Data
US 2012/0086465 A1     Apr. 12, 2012

(51) Int. Cl.
*G01R 27/26*     (2006.01)
(52) U.S. Cl.
USPC ............ 324/679; 324/658; 324/686; 324/691
(58) Field of Classification Search ........... 324/658–690
See application file for complete search history.

(56) References Cited

U.S. PATENT DOCUMENTS

| | | | |
|---|---|---|---|
| 6,624,640 B2 * | 9/2003 | Lund et al. | 324/678 |
| 7,015,705 B2 * | 3/2006 | Inaba et al. | 324/678 |
| 7,288,946 B2 * | 10/2007 | Hargreaves et al. | 324/678 |
| 2011/0133757 A1 * | 6/2011 | Chae et al. | 324/678 |
| 2012/0062247 A1 * | 3/2012 | Chang | 324/679 |

* cited by examiner

*Primary Examiner* — Huy Q Phan
*Assistant Examiner* — Dustin Dickinson
(74) *Attorney, Agent, or Firm* — Chun-Ming Shih; HDLS IPR Services

(57) ABSTRACT

A measuring apparatus for capacitor is applied to a charging power source and a capacitor to be measured. The measuring apparatus for capacitor includes a microcontroller unit, an analog-digital converter unit, a charging-side switch unit, a charging-side resistor unit, a discharging-side switch unit and a discharging-side resistor unit. The capacitor to be measured is charged and discharged by the charging-side switch unit and the discharging-side switch unit controlled by the microcontroller unit. The charging and discharging voltage and time variation of the capacitor to be measured are measured by the analog-digital converter unit to calculate the capacitance value of the capacitor to be measured.

9 Claims, 5 Drawing Sheets ated by the microcontroller unit. Finally, the charging voltage and time variation of the capacitor to be measured are measured by the analog-digital converter unit to calculate the capacitance value of the capacitor to be measured.

MEASURING APPARATUS AND METHOD FOR CAPACITOR

BACKGROUND OF THE INVENTION

1. Field of the Invention

The present invention relates to a measuring apparatus and method and in particular to a measuring apparatus and method for capacitor.

2. Description of Prior Art

Capacitors are very common electronic components and are almost used in all electronic products. Thus, the electronic engineers always need to know the capacitance values of the capacitors used on PCB, so that the design or calibration of the electronic circuits would be done well. A good meter should have the function of measuring the capacitance values of capacitors. It is important and indispensable.

However, the prior art technology of measuring the capacitance values of capacitors takes longer time. The technology of measuring the capacitance values of capacitors with shorter time needs complicated design such as multiple reversing amplifiers, and the cost is not cheap. Therefore, it is an important issue to quickly measure the capacitance values of capacitors while the measuring circuit is not complicated.

SUMMARY OF THE INVENTION

In order to solve the above-mentioned problems, an object of the present invention is to provide a measuring apparatus for capacitor. The circuit structure of the present invention is simple and is able to quickly measure the capacitance values of capacitors.

In order to solve the above-mentioned problems, another object of the present invention is to provide a measuring method for capacitor. The circuit structure of the present invention is simple and is able to quickly measure the capacitance values of capacitors.

In order to achieve the object of the present invention mentioned above, the measuring apparatus for capacitor of the present invention is applied to a charging power source and a capacitor to be measured. The measuring apparatus for capacitor includes a microcontroller unit, an analog-digital converter unit electrically connected to the microcontroller unit and the capacitor to be measured, a charging-side switch unit electrically connected to the microcontroller unit and the charging power source, a charging-side resistor unit electrically connected to the charging-side switch unit, a discharging-side switch unit electrically connected to the microcontroller unit and the charging-side resistor unit and a discharging-side resistor unit electrically connected to the discharging-side switch unit, the charging-side resistor unit, the analog-digital converter unit and the capacitor to be measured. The capacitor to be measured is charged and discharged by the charging-side switch unit and the discharging-side switch unit controlled by the microcontroller unit. The charging and discharging voltage and time variation of the capacitor to be measured are measured by the analog-digital converter unit to calculate the capacitance value of the capacitor to be measured.

In order to achieve another object of the present invention mentioned above, the measuring method for capacitor of the present invention is applied to a charging power source and a capacitor to be measured. The measuring method for capacitor includes below steps. First, a microcontroller unit is provided. Afterward, an analog-digital converter unit is provided and is electrically connected to the microcontroller unit and the capacitor to be measured. Afterward, a charging-side switch unit is provided and is electrically connected to the microcontroller unit and the charging power source. Afterward, a charging-side resistor unit is provided and is electrically connected to the charging-side switch unit. Afterward, a discharging-side switch unit is provided and is electrically connected to the microcontroller unit and the charging-side resistor unit. Afterward, a discharging-side resistor unit is provided and is electrically connected to the discharging-side switch unit, the charging-side resistor unit, the analog-digital converter unit and the capacitor to be measured. Afterward, the capacitor to be measured is charged by the charging-side switch unit and the discharging-side switch unit controlled by the microcontroller unit. Finally, the charging voltage and time variation of the capacitor to be measured are measured by the analog-digital converter unit to calculate the capacitance value of the capacitor to be measured.

DETAILED DESCRIPTION OF THE INVENTION

Figure 1:
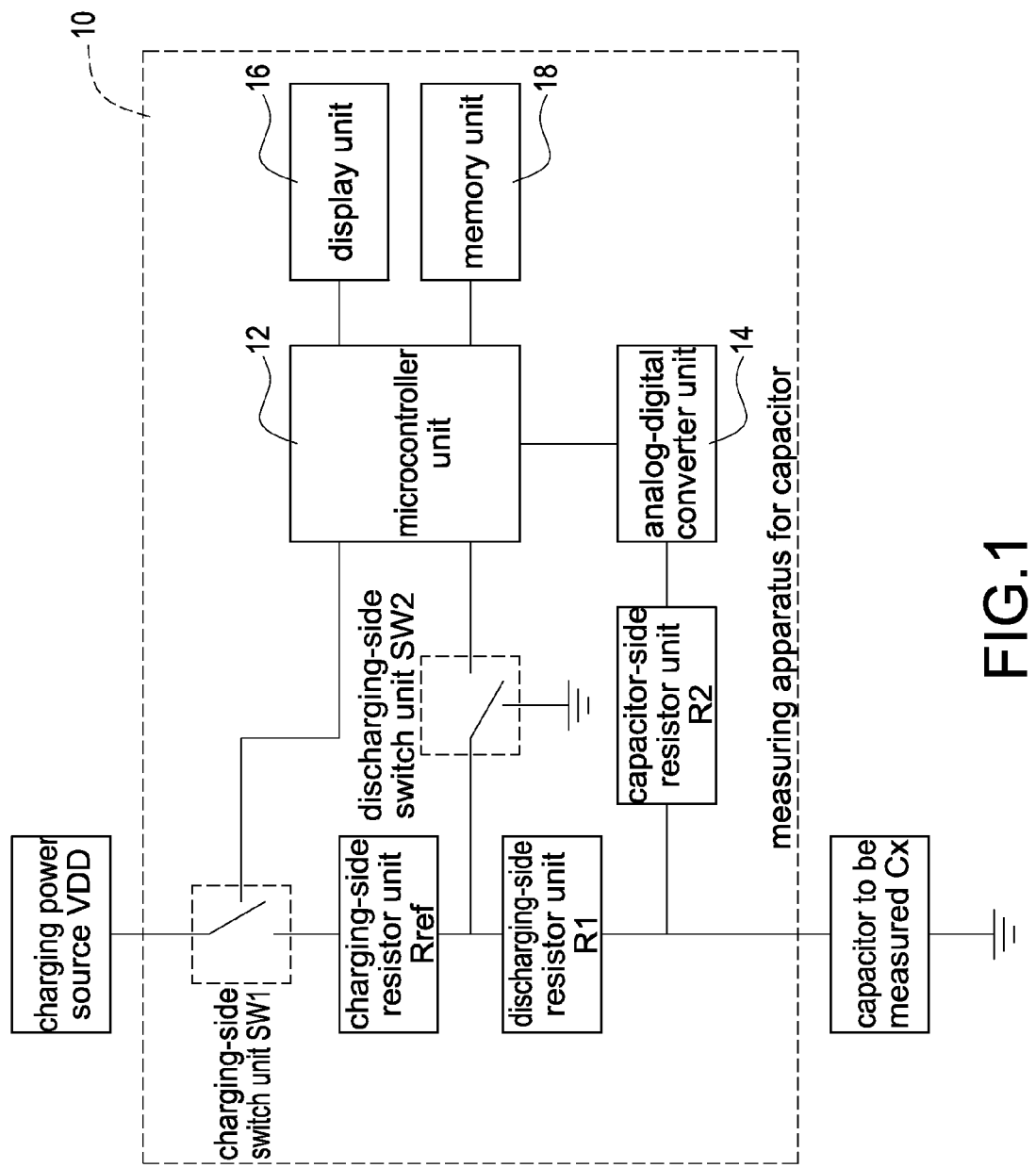
FIG. 1 shows a block diagram of a measuring apparatus for capacitor of the present invention.

FIG. 1 shows a block diagram of a measuring apparatus for capacitor of the present invention. The measuring apparatus for capacitor 10 is applied to a charging power source VDD and a capacitor Cx to be measured. The measuring apparatus 10 includes a microcontroller unit 12, an analog-digital converter unit 14, a display unit 16, a memory unit 18, a charging-side switch unit SW1, a discharging-side switch unit SW2, a charging-side resistor unit Ref, a discharging-side resistor unit R1 and a capacitor-side resistor unit R2.

The microcontroller unit 12 is electrically connected to the analog-digital converter unit 14, the display unit 16, the memory unit 18, the charging-side switch unit SW1, and the discharging-side switch unit SW2. The capacitor-side resistor unit R2 is electrically connected to the analog-digital converter unit 14, the capacitor Cx to be measured, and the discharging-side resistor unit R1. Moreover, the charging-side switch unit SW1 is electrically connected to the charging power source VDD and the charging-side resistor unit Ref. Moreover, the discharging-side switch unit SW2 is electrically connected to the charging-side resistor unit Ref and the discharging-side resistor unit R1. Moreover, the discharging-side resistor unit R1 is electrically connected to the charging-side resistor unit Ref and the capacitor Cx to be measured.

The capacitor Cx to be measured is charged and discharged by the charging-side switch unit SW1 and the discharging-side switch unit SW2, both of which are controlled by the microcontroller unit 12. The charging and discharging voltage and time variation of the capacitor Cx to be measured are measured by the analog-digital converter unit 14 to calculate the capacitance value of the capacitor Cx to be measured (more detail will be described afterward). The display unit 16 could be an LCD. The memory unit 18 could be an EEPROM. The analog-digital converter unit 14 could be a fast high-resolution analog-digital converter.

Another embodiment of the present invention is that the discharging-side switch unit SW2 is not electrically connected to the ground, but the charging power source VDD has two kinds of power sources. When charging, the charging power source VDD outputs positive voltage. When discharging, the charging power source VDD outputs negative voltage.

Figure 2:
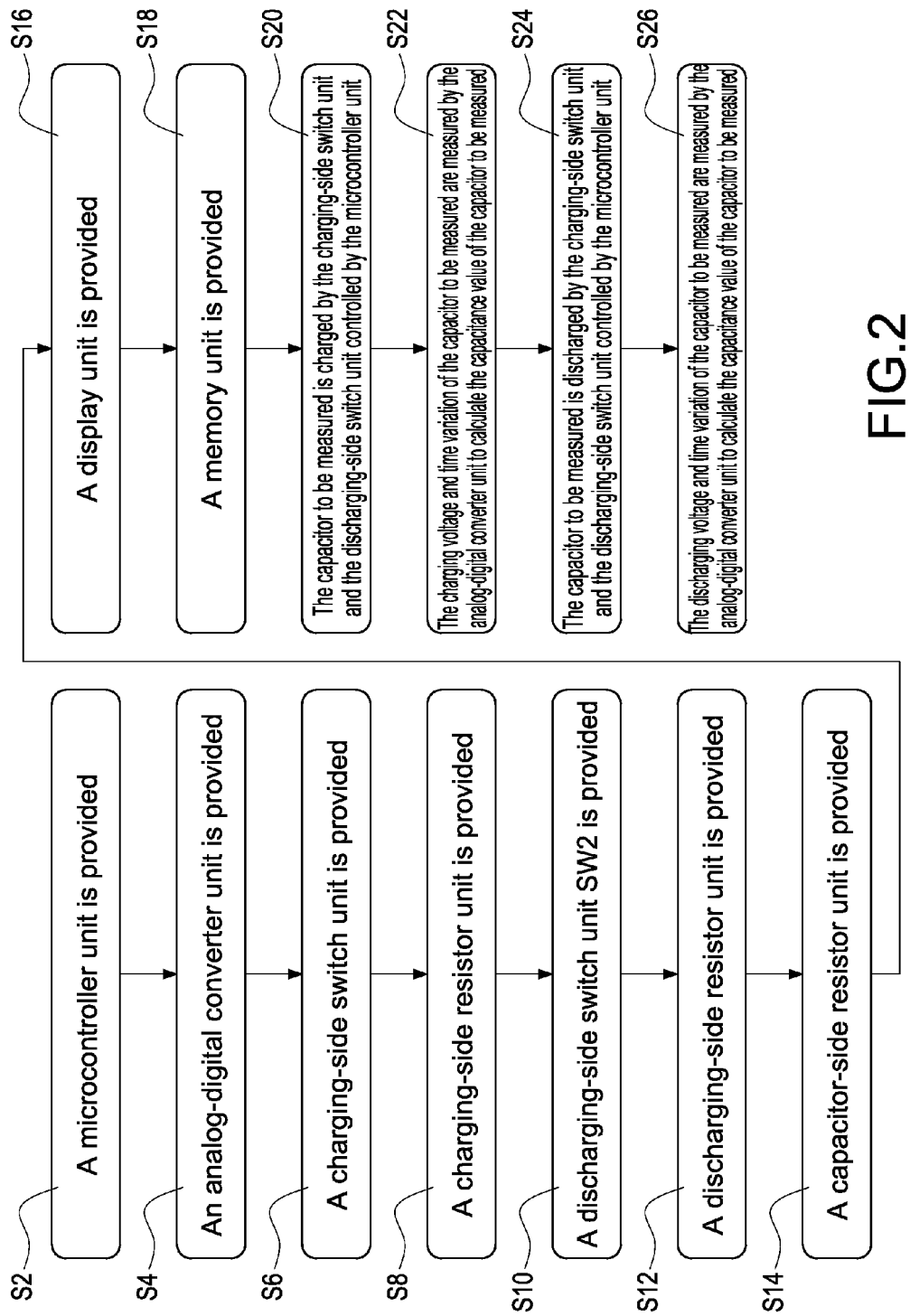
FIG. 2 shows a flowchart of a measuring method for capacitor of the present invention.

FIG. 2 shows a flowchart of a measuring method for capacitor according to the present invention. Please also refer to FIG. 1, the measuring method for capacitor of the present invention is applied to a charging power source VDD and a capacitor Cx to be measured. The measuring method for capacitor includes below steps (S02~S26):

S02 A microcontroller unit 12 is provided.

S04 An analog-digital converter unit 14 is provided. The analog-digital converter unit 14 is electrically connected to the microcontroller unit 12 and the capacitor Cx to be measured.

S06 A charging-side switch unit SW1 is provided. The charging-side switch unit SW1 is electrically connected to the microcontroller unit 12 and the charging power source VDD.

S08 A charging-side resistor unit Rref is provided. The charging-side resistor unit Rref is electrically connected to the charging-side switch unit SW1.

S10 A discharging-side switch unit SW2 is provided. The discharging-side switch unit SW2 is electrically connected to the microcontroller unit 12 and the charging-side resistor unit Rref.

S12 A discharging-side resistor unit R1 is provided. The discharging-side resistor unit R1 is electrically connected to the discharging-side switch unit SW2, the charging-side resistor unit Rref, the analog-digital converter unit 14 and the capacitor Cx to be measured.

S14 A capacitor-side resistor unit R2 is provided. The capacitor-side resistor unit R2 is electrically connected to the discharging-side resistor unit R1, the analog-digital converter unit 14 and the capacitor Cx to be measured.

S16 A display unit 16 is provided. The display unit 16 is electrically connected to the microcontroller unit 12.

S18 A memory unit 18 is provided. The memory unit 18 is electrically connected to the microcontroller unit 12.

S20 The capacitor Cx to be measured is charged by the charging-side switch unit SW1 and the discharging-side switch unit SW2, where both of which are controlled by the microcontroller unit 12.

S22 The charging voltage and time variation of the capacitor to be measured Cx are measured by the analog-digital converter unit 14 to calculate the capacitance value of the capacitor to be measured Cx (will be described in details afterward).

S24 The capacitor Cx to be measured is discharged by the charging-side switch unit SW1 and the discharging-side switch unit SW2, where both of which are controlled by the microcontroller unit 12.

S26 The discharging voltage and time variation of the capacitor Cx to be measured are measured by the analog-digital converter unit 14 to calculate the capacitance value of the capacitor Cx to be measured (the detail will be described afterward).

Figure 3:
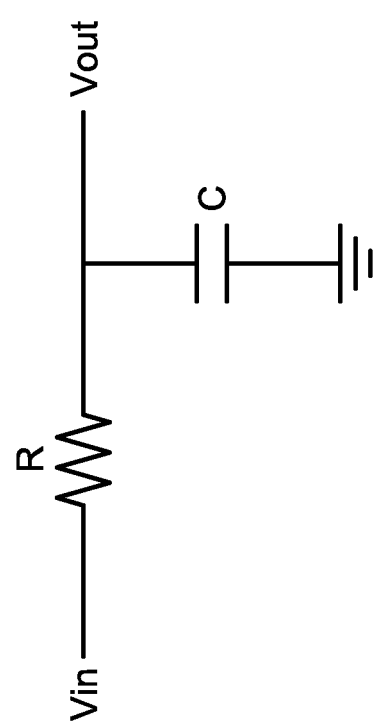
FIG. 3 shows a circuit diagram of charging and discharging a capacitor.

FIG. 3 shows a circuit diagram of charging and discharging a capacitor. One side of an input-side resistor R is electrically connected to an input voltage Vin. The other side of the input-side resistor R is electrically connected to an output voltage Vout and one side of an output-side capacitor C. The other side of the output-side capacitor C is connected to the ground.

For easier understanding, the below mathematical operations is deduced with symbols. Moreover, the symbol e is the Euler constant and the symbol ln is the logarithmic function of the base number for e. The correlation of the output voltage Vout, the input voltage Vin, the input-side resistor R, and the output-side capacitor C is:

$$Vout = Vin(1 - e^{-t/RC})$$

after deducting:

$$Vout/Vin = 1 - e^{-t/RC}$$

$$e^{-t/RC} = 1 - (Vout/Vin)$$

$$\ln e^{-t/RC} = \ln[1 - (Vout/Vin)]$$

$$-t/RC = \ln[1 - (Vout/Vin)]$$

$$t = -RC * \ln[1 - (Vout/Vin)]$$

$$1/C = -R * \ln[1 - (Vout/Vin)]/t$$

$$C = -t/\{R * \ln[1 - (Vout/Vin)]\}$$

Please refer to FIG. 1 again, so $$Cx = -Tchg/\{(Rref + R1) * \ln[1 - (\Delta V/VDD)]\}$$

wherein, Tchg is the charging time, and $\Delta V$ is the charging voltage variation. Similarly, when discharging:

$$Tdisc = -R1 * Cx * \ln[1 - (V2/V1)]$$

so $Cx = -Tdisc/\{R1 * \ln[1 - (V2/V1)]\}$

Moreover, Tdisc is the discharging time, and V2 is the voltage after discharging, and V1 is the voltage before discharging. When charging, the charging power source VDD is electrically connected to the charging-side resistor unit Rref by the charging-side switch unit SW1. The discharging-side switch unit SW2 is not connected to the ground. When discharging, the charging power source VDD is cut from the charging-side resistor unit Rref by the charging-side switch unit SW1. The discharging-side switch unit SW2 is connected to the ground.

Figure 4:
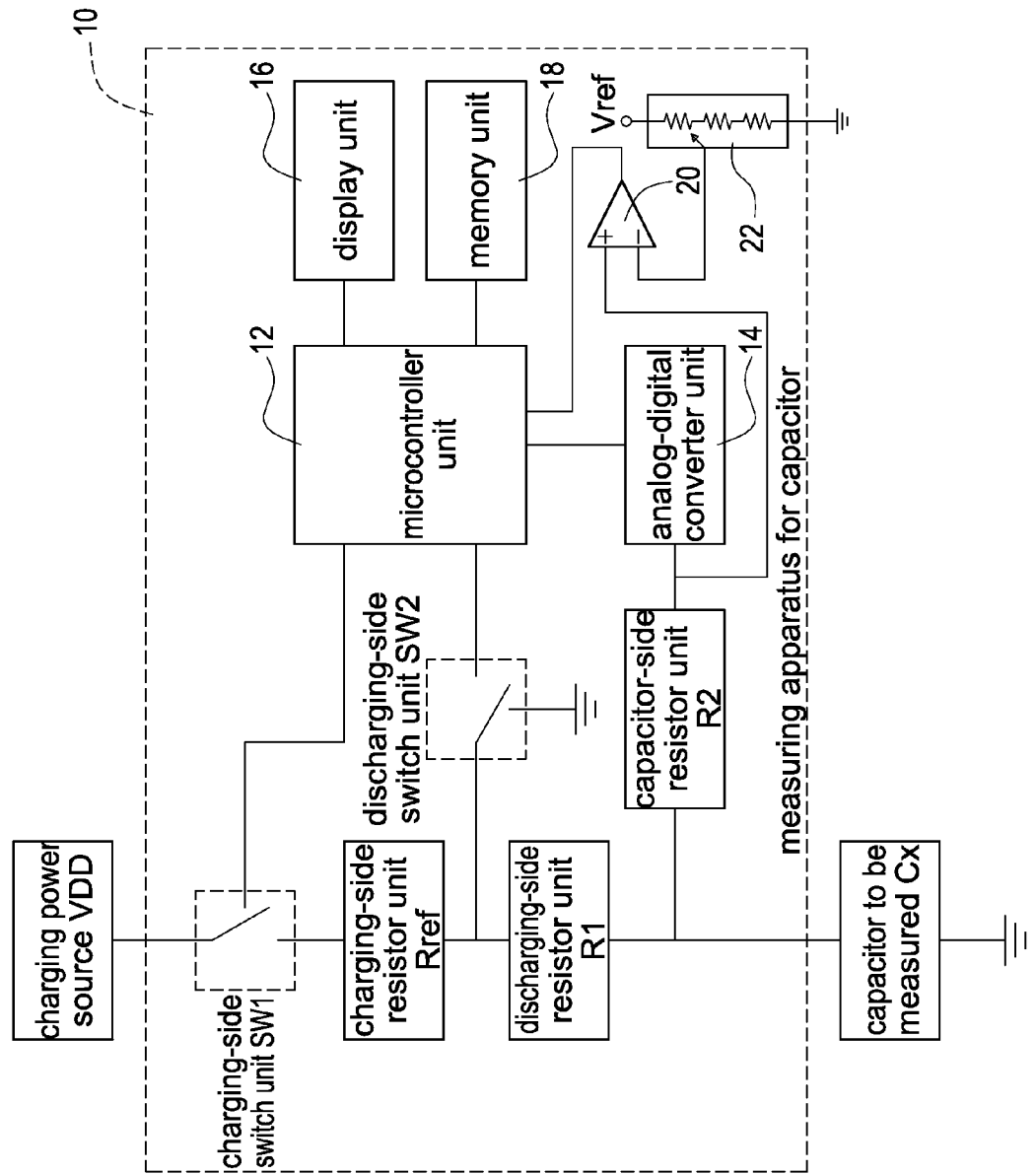
FIG. 4 shows a block diagram of another embodiment of a measuring apparatus for capacitor of the present invention.

FIG. 4 shows a block diagram of another embodiment of the measuring apparatus for capacitor of the present invention. The elements in FIG. 4 same with those in FIG. 1 will not be described again. The differences between FIG. 4 and FIG. 1 are that a programmable comparator 20 and a change-over switch 22 are provided in FIG. 4. The programmable comparator 20 is electrically connected to the analog-digital converter unit 14, the capacitor-side resistor unit R2, the microcontroller unit 12, and the change-over switch 22. Moreover, the change-over switch 22 is electrically connected between a reference voltage Vref and the ground.

Thus, similar with the mathematical operations shown above:

$$Cx = -Tchg/\{(Rref + R1) * \ln[(VDD - VD)/(VDD - VC)]\}$$

Moreover, the VD is the voltage which is charged well, and the VC is the voltage before charged.

The programmable comparator 20 is controlled by the change-over switch 22 to set in different voltage to detect the voltage variation of capacitor. The microcontroller unit 12 is informed by the programmable comparator 20 to accurately and fast set in different voltage level. The measuring speed and efficiency are increased substantially because the charging time and the discharging time are detected instantaneously. No matter what capacitance value of capacitor is, it is easily measured.

Figure 5:
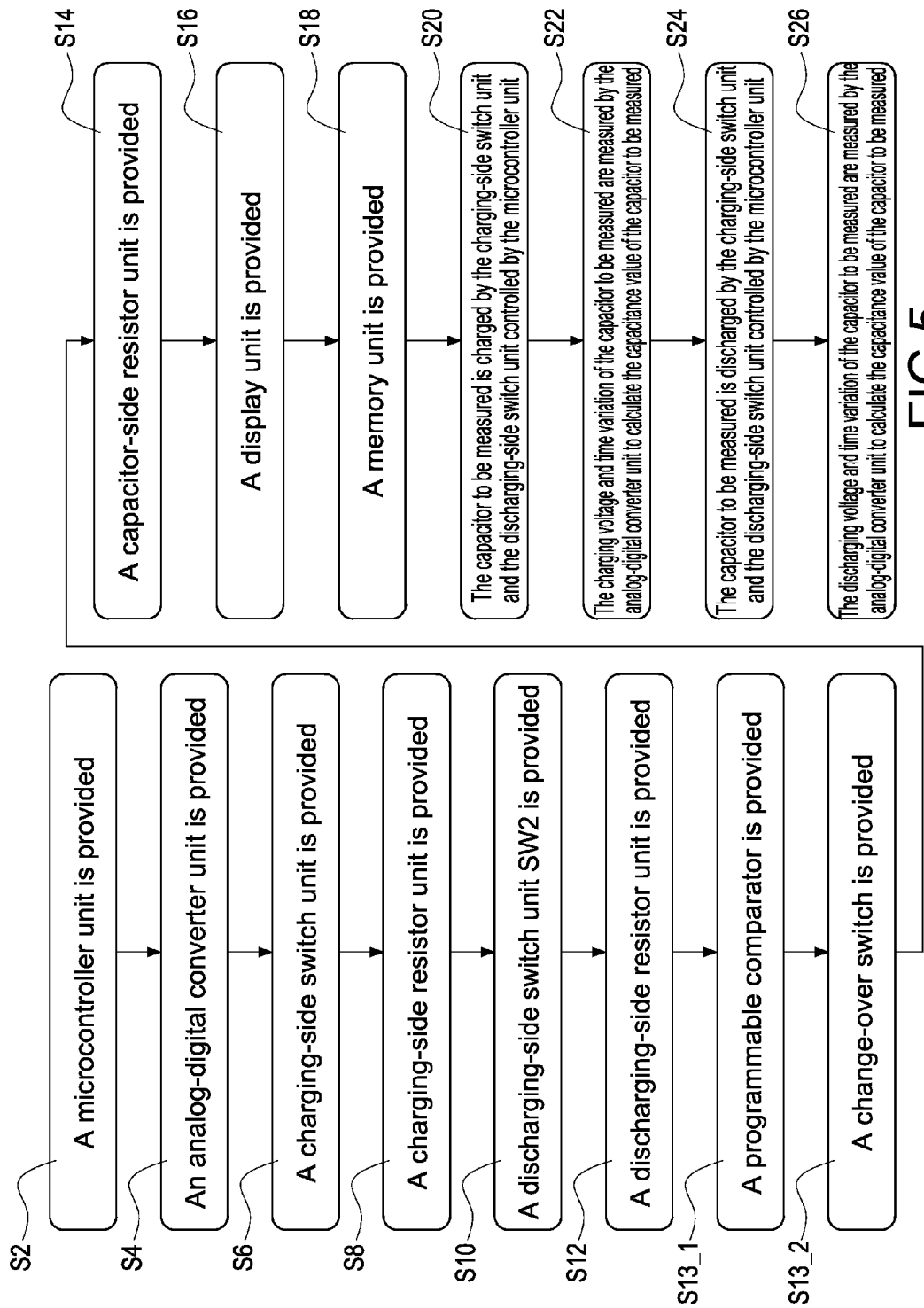
FIG. 5 shows a flowchart of another embodiment of a measuring method for capacitor of the present invention.

FIG. 5 shows a flowchart of another embodiment of the measuring method for capacitor of the present invention. Please also refer to FIG. 4, the elements in FIG. 5 same with those in FIG. 2 will not be described again. The differences between FIG. 4 and FIG. 1 are that there are one step S13_1 and one step 13_2 are added between step S12 and S14:

S13_1 A programmable comparator 20 is provided. The programmable comparator 20 is electrically connected to the analog-digital converter unit 14, the discharging-side resistor unit R1, the capacitor Cx to be measured, and the microcontroller unit 12.

S13_2 A change-over switch 22 is provided. The change-over switch 22 is electrically connected to the programmable comparator 20.

The measuring apparatus for capacitor 10 of the present invention not only has simple circuit structure but also has short time of measuring capacitance values of capacitors. For example, if capacitance value of the capacitor Cx to be measured is 10000 uF, and the sum of resistance values of the charging-side resistor unit Rref and the discharging-side resistor unit R1 is 6.2K OHM, the measuring time is only about 2 seconds.

Although the present invention has been described with reference to the preferred embodiment thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A measuring apparatus for capacitor applied to a charging power source and a capacitor to be measured, the measuring apparatus including:
   a microcontroller unit;
   an analog-digital converter unit, wherein the analog-digital converter unit is electrically connected to the microcontroller unit and the capacitor to be measured;
   a charging-side switch unit, wherein the charging-side switch unit is electrically connected to the microcontroller unit and the charging power source;
   a charging-side resistor unit, wherein the charging-side resistor unit is electrically connected to the charging-side switch unit;
   a discharging-side switch unit, wherein the discharging-side switch unit is electrically connected to the microcontroller unit and the charging-side resistor unit; and
   a discharging-side resistor unit, wherein the discharging-side resistor unit is electrically connected to the discharging-side switch unit, the charging-side resistor unit, the analog-digital converter unit and the capacitor to be measured, and the discharging-side resistor is directly connected between the charging-side resistor unit and the capacitor to be measured,
   wherein the capacitor to be measured is charged and discharged by the charging-side switch unit and the discharging-side switch unit, both of which are controlled by the microcontroller unit; charging and discharging voltage and time variation of the capacitor to be measured are measured by the analog-digital converter unit to calculate a capacitance value of the capacitor to be measured, and
   when charging the charging power source is electrically connected to the charging-side resistor unit by the charging-side switch unit and the discharging-side switch unit is not connected to a ground, so that the capacitance value is calculated as:

$$C_x = -T_{chg}/\{(R_{ref}+R_1)*\ln[1=(\Delta V/V_{DD})]\}$$

wherein, $C_x$ is capacitance value, $T_{chg}$ is a charging time, $R_{ref}$ is a resistance value of the charging-side resistor unit, $R_1$ is a resistance value of the discharging-side resistor unit, $V_{DD}$ is a voltage value of the charging power source and $\Delta V$ is a charging voltage variation, and
   when discharging, the charging power source is cut from the charging-side resistor unit by the charging-side switch unit and the discharging-side switch unit is connected to the ground, so that the capacitance value is calculated as:

$$C_x = -T_{disc}/\{R_1*\ln[1-(V_2/V_1)]\}$$

wherein, $T_{disc}$ is a discharging time, V2 is a voltage after discharging and V1 is a voltage before discharging.

2. The measuring apparatus for capacitor in claim 1, further including:
   a programmable comparator, wherein the programmable comparator is electrically connected to the analog-digital converter unit, the discharging-side resistor unit, the capacitor to be measured, and the microcontroller unit; and
   a change-over switch including a plurality of resistors, wherein the change-over switch is electrically connected to the programmable comparator and is directly connected between a reference voltage and the ground,
   wherein the programmable comparator is controlled by the change-over switch to set in different voltage to detect a voltage variation of capacitor to be measured, and the microcontroller unit is informed by the programmable comparator to accurately and fast set in different voltage level, so that the capacitance value is calculated as:

$$Cx = -T_{chg}/\{(R_{ref}+R_1)*lN[(V_{DD}-V_D)/(V_{DD}-V_C)]\}$$

Moreover, $V_D$ is a voltage of the capacitor to be measured which is charged well, and the $V_C$ is a voltage of the capacitor to be measured before charged.

3. The measuring apparatus for capacitor in claim 2, further including:
   a capacitor-side resistor unit, wherein the capacitor-side resistor unit is electrically connected to the discharging-side resistor unit, the programmable comparator, the analog-digital converter unit and the capacitor to be measured; and
   a display unit, wherein the display unit is electrically connected to the microcontroller unit.

4. The measuring apparatus for capacitor in claim 3, further including:
   a memory unit, wherein the memory unit is electrically connected to the microcontroller unit.

5. The measuring apparatus for capacitor in claim 4, wherein the analog-digital converter unit is a fast high-resolution analog-digital converter.

6. A measuring method for capacitor applied to a charging power source and a capacitor to be measured, the measuring method for capacitor including below steps:
   a. providing a microcontroller unit;
   b. providing an analog-digital converter unit, wherein the analog-digital converter unit is electrically connected to the microcontroller unit and the capacitor to be measured;
   c. providing a charging-side switch unit, wherein the charging-side switch unit is electrically connected to the microcontroller unit and the charging power source;

d. providing a charging-side resistor unit, wherein the charging-side resistor unit is electrically connected to the charging-side switch unit;
e. providing a discharging-side switch unit, wherein the discharging-side switch unit is electrically connected to the microcontroller unit and the charging-side resistor unit;
f. providing a discharging-side resistor unit, wherein the discharging-side resistor unit is electrically connected to the discharging-side switch unit, the charging-side resistor unit, the analog-digital converter unit, and the capacitor to be measured, and the discharging-side resistor is directly connected between the charging-side resistor unit and the capacitor to be measured;
g. controlling the charging-side switch unit and the discharging-side switch unit by the microcontroller unit to charge the capacitor to be measured;
h. measuring the charging voltage and time variation of the capacitor to be measured by the analog-digital converter unit to calculate a capacitance value of the capacitor to be measured,
i. controlling the charging-side switch unit and the discharging-side switch unit by the microcontroller unit to discharge the capacitor to be measured; and
j. measuring discharging voltage and time variation of the capacitor to be measured by the analog-digital converter unit to calculate the capacitance value of the capacitor to be measured,
wherein when charging, the charging power source is electrically connected to the charging-side resistor unit by the charging-side switch unit and the discharging-side switch unit is not connected to a ground, so that the capacitance value is calculated as:

$$C_x = -T_{chg}/\{(R_{ref}+R_1)*\ln[1-(\Delta V/V_{DD})]\}$$

wherein, $C_x$ is capacitance value, $T_{chg}$ is a charging time, $R_{ref}$ is a resistance value of the charging-side resistor unit, $R_1$ is a resistance value of the discharging-side resistor unit, $V_{DD}$ is a voltage value of the charging power source and $\Delta V$ is a charging voltage variation, and
when discharging, the charging power source is cut from the charging-side resistor unit by the charging-side switch unit and the discharging-side switch unit is connected to the ground, so that the capacitance value is calculated as:

$$C_x = -T_{disc}/\{R_1*\ln[1=(V_2/V_1)]\}$$

wherein, $T_{disc}$ is a discharging time, V2 is a voltage after discharging and V1 is a voltage before discharging.

7. The measuring method for capacitor in claim 6, further including:
k. providing a programmable comparator, wherein the programmable comparator is electrically connected to the analog-digital converter unit, the discharging-side resistor unit, the capacitor to be measured, and the microcontroller unit; and
l. providing a change-over switch, wherein the change-over switch including a plurality of resistors is electrically connected to the programmable comparator and is electrically connected between a reference voltage and the ground,
wherein the programmable comparator is controlled by the change-over switch to set in different voltage to detect a voltage variation of capacitor to be measured, and the microcontroller unit is informed by the programmable comparator to accurately and fast set in different voltage level, so that the capacitance value is calculated as:

$$Cx = -T_{chg}/\{(R_{ref}+R_1)*IN[(V_{DD}-V_D)/(V_{DD}-V_C)]\}$$

Moreover, $V_D$ is a voltage of the capacitor to be measured which is charged well, and the $V_C$ is a voltage of the capacitor to be measured before charged.

8. The measuring method for capacitor in claim 7, further including:
m. providing a capacitor-side resistor unit, wherein the capacitor-side resistor unit is electrically connected to the discharging-side resistor unit, the programmable comparator, the analog-digital converter unit and the capacitor to be measured; and
n. providing a display unit, wherein the display unit is electrically connected to the microcontroller unit.

9. The measuring method for capacitor in claim 8, further including:
o. providing a memory unit, wherein the memory unit is electrically connected to the microcontroller unit.

* * * * *